(12) United States Patent
Kim et al.

(10) Patent No.: US 11,301,211 B2
(45) Date of Patent: Apr. 12, 2022

(54) DIFFERENTIAL MIXED SIGNAL MULTIPLIER WITH THREE CAPACITORS

(71) Applicant: INTERNATIONAL BUSINESS MACHINES CORPORATION, Armonk, NY (US)

(72) Inventors: Seyoung Kim, Westchester, NY (US); Mingu Kang, Old Tappan, NJ (US); Kyu-hyoun Kim, Chappaqua, NY (US); Seonghoon Woo, New York, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 102 days.

(21) Appl. No.: 16/847,505

(22) Filed: Apr. 13, 2020

(65) Prior Publication Data
US 2021/0318852 A1    Oct. 14, 2021

(51) Int. Cl.
*G06F 7/44* (2006.01)
*G06J 1/00* (2006.01)

(52) U.S. Cl.
CPC . *G06F 7/44* (2013.01); *G06J 1/00* (2013.01)

(58) Field of Classification Search
CPC .......... G06F 7/44; G06F 7/523; G06F 7/5443; G06J 1/00; G06J 1/005; G06N 3/063–0635; G06N 3/04; H03K 2217/9605
See application file for complete search history.

(56) References Cited

U.S. PATENT DOCUMENTS

| | | | |
|---|---|---|---|
| 8,275,727 B2 | 9/2012 | Elmegreen et al. | |
| 9,503,118 B2 | 11/2016 | Zhang et al. | |
| 9,646,243 B1 | 5/2017 | Gokmen | |
| 9,793,912 B1 | 10/2017 | Ferris et al. | |
| 10,255,205 B1 | 4/2019 | Fick et al. | |
| 2019/0080231 A1 | 3/2019 | Nestler et al. | |
| 2019/0392298 A1* | 12/2019 | Oshima | G06N 3/0635 |
| 2020/0401206 A1* | 12/2020 | Kallam | G06F 7/5443 |

OTHER PUBLICATIONS

Bankman et al., "Passive Charge Redistribution Digital-to analogue Multiplier", Electronics Letters, Mar. 2015, pp. 386-388, vol. 51, No. 5.

(Continued)

*Primary Examiner* — Emily E Larocque
*Assistant Examiner* — Huy Duong
(74) *Attorney, Agent, or Firm* — Tutunjian & Bitetto, P.C.; Randall Bluestone

(57) ABSTRACT

A differential mixed-signal logic processor is provided. The differential mixed-signal logic processor includes a plurality of mixed-signal multiplier branches for multiplication of an analog value A and a N-bit digital value B. Each of the plurality of mixed-signal multiplier branches include a first capacitor connected across a second capacitor and a third capacitor to provide a differential output across the second and third capacitors. A capacitance of the first capacitor is equal to half a capacitance of the second and third capacitors.

20 Claims, 8 Drawing Sheets

(56) References Cited

OTHER PUBLICATIONS

Bankman et al., "An 8-bit, 16 input, 3.2 pJ/op Switched-Capacitor Dot Product Circuit in 28-nm FDSOI CMOS", IEEE Asian Solid-State Circuits Conference, Nov. 2016, pp. 21-24.

Gamal et al., "An Introduction to the Technology, Design and Performance Limits, Presenting Recent Developements and Features Directions", CMOA Image Sensors, IEEE Circuits & Device Magazine, Jun. 2005, pp. 6-20.

Kang et al., "An In-Memory VLSI Architecture for Convolutional Neural Networks", on Emerging and Selected Topics in Circuits and Systems, Sep. 2018, pp. 494-505, vol. 8, No. 3.

Kang et al., "A Multi-Functional In-Memory Inference Processor Using a Standard 6T SRAM Array", IEEE Journal of Solid-State Circuits, Feb. 2018, pp. 642-654, vol. 53, No. 2.

Li et al., "Capacitor-based Cross-point Array for Analog Neural Network with Record Symmetry and Linearity", 2018 Symposium on VLSI Technology Digest of Technical Papers, Jun. 2018, pp. 25-26.

Verma et al., "Micro-power EEG Acquisition SoC with Integrated Seizure Detection Processor for Continuous Patient Monitoring", 2009 Symposium on VLSI Circuits Digest of Technical Papers, Jul. 2009, pp. 62-63.

\* cited by examiner

DIFFERENTIAL MIXED SIGNAL MULTIPLIER WITH THREE CAPACITORS

BACKGROUND

The present invention generally relates to electronic circuits, and more particularly to a differential mixed signal multiplier with three capacitors.

Emerging sensor-rich platforms such as Internet of Things (IoT), health care, autonomous driving often demand local decision making capability using Machine Learning (ML) algorithms. Those applications require ultra-low power operation in battery-operated platforms, but most of those require expensive analog-to-digital conversion (ADC) as the sampled data is in the analog domain. Not only the sensor applications, but also many emerging computing platforms such as in-memory computing, neuromorphic computing (e.g., Resistive Random Access Memory (ReRAM)-based computing), and so forth often generate intermediate results in analog domain.

Therefore, analog and digital mixed-signal processing is a good alternative to avoid such high costs from ADC. Although analog processing suffers from non-idealities in low-power regime, machine learning algorithms typically have high inherent noise immunity, which makes the approximate computing such as low-power mixed-signal processing more attractive. The key computing kernel of most machine learning algorithms is multiplication. Naturally, mixed signal multiplication between analog value (from sensor or neuromorphic computing block) and digital value (from memory) is an essential computing component.

SUMMARY

According to aspects of the present invention, a differential mixed-signal logic processor is provided. The differential mixed-signal logic processor includes a plurality of mixed-signal multiplier branches for multiplication of an analog value A and a N-bit digital value B. Each of the plurality of mixed-signal multiplier branches include a first capacitor connected across a second capacitor and a third capacitor to provide a differential output across the second and third capacitors. A capacitance of the first capacitor is equal to half a capacitance of the second and third capacitors.

According to other aspects of the present invention, method is provided for forming a differential mixed-signal processor. The method includes arranging each a plurality of mixed-signal multiplier branches for multiplication of an analog value and a N-bit digital value B to include a first capacitor connected across a second capacitor and a third capacitor to provide a differential output across the second and third capacitors. A capacitance of the first capacitor is equal to half a capacitance of the second and third capacitors.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention are directed to a differential mixed signal multiplier with three capacitors.

One or more embodiments of the present invention can be directed to dot-product with differential signed number representation. However, it is to be appreciated that other or the same embodiments can also be directed to other numerical and logic functions involving mixed (analog and digital) signals.

One or more embodiments of the present invention utilize one three capacitors for any bit precision of value B, where B relates to a multiplication between an analog value A and a N-bit digital value B as follows $B=2^{N-1}b_{N-1}+2^{N-1}b_{N-2}\ldots+2^0b_0$, where $b_n$ is binary value at n-th bit position. Each branch requires only three capacitors for any bit precision of value B.

In one or more embodiments of the present invention, each mixed-signal multiplier branch includes a first capacitor connected across a second and a third capacitor to provide a differential output across the second and third capacitors.

In one or more embodiments of the present invention, a capacitance of the first capacitor is equal to half a capacitance of the second and third capacitors.

Accordingly, for an eight bit digital value, embodiments of the proposed multiplier require about >100× smaller capacitor area and lower energy consumption to charge the capacitors. That is, the proposed multiplier uses only three capacitors sized as described herein for any bit precision requirements, which significantly saves area and energy cost.

One or more embodiments of the proposed multiplier also cover the signed representation for both operands in the multiplication.

One or more embodiments of the proposed multiplier use a differential input for higher signal integrity.

One or more embodiments of the proposed multiplier also computes the dot product, which is the summation across many multiplied results.

Figure 1:
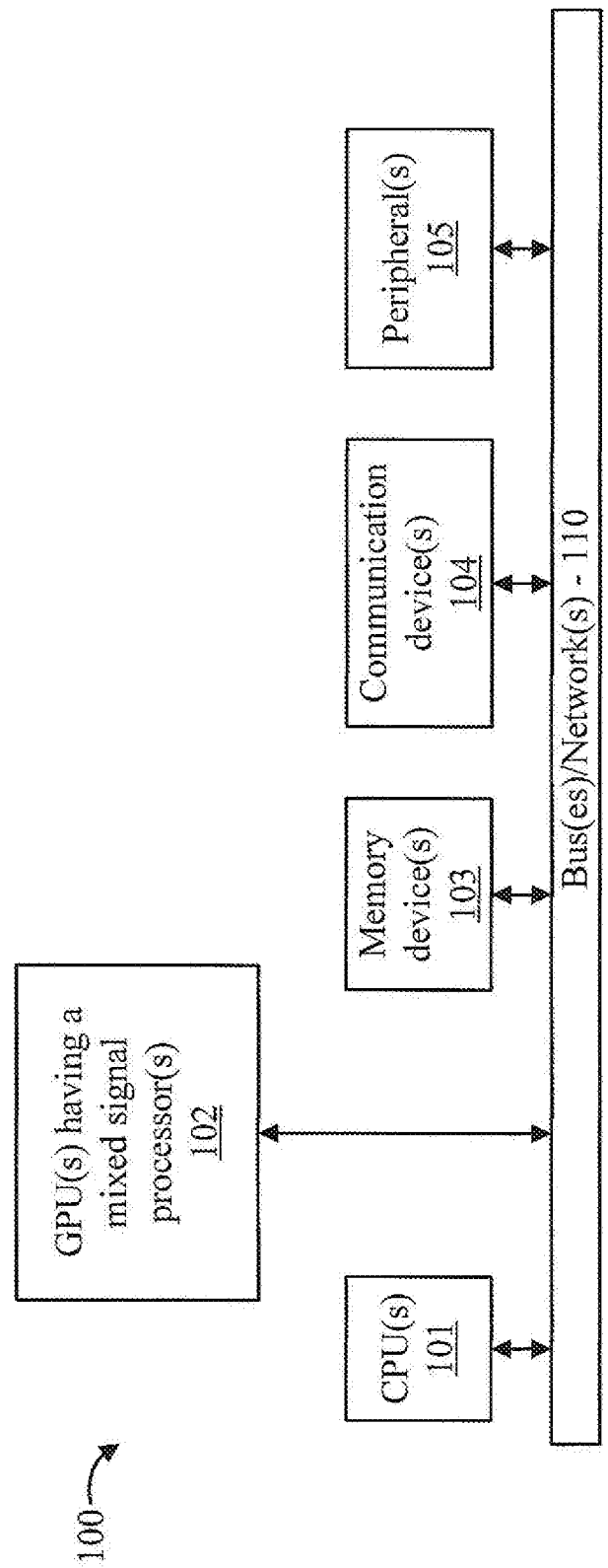
FIG. 1 is a block diagram showing an exemplary processing system, in accordance with an embodiment of the present invention.

FIG. 1 is a block diagram showing an exemplary processing system 100, in accordance with an embodiment of the present invention. The processing system 100 includes a set of processing units (e.g., CPUs) 101, a set of GPUs 102, a set of memory devices 103, a set of communication devices 104, and set of peripherals 105. The CPUs 101 can be single or multi-core CPUs. The GPUs 102 can be single or multi-core GPUs. At least one of the CPUs 101 and/or the GPUs 102 include a differential mixed signal processor with three capacitors per multiplier to perform logic functions such as dot product. The one or more memory devices 103 can include caches, RAMs, ROMs, and other memories (flash, optical, magnetic, etc.). The communication devices 104 can include wireless and/or wired communication devices (e.g., network (e.g., WIFI, etc.) adapters, etc.). The peripherals 105 can include a display device, a user input device, a printer, an imaging device, and so forth. Elements of processing system 100 are connected by one or more buses or networks (collectively denoted by the figure reference numeral 110).

In an embodiment, memory devices 103 can store specially programmed software modules to transform the computer processing system into a special purpose computer configured to implement various aspects of the present invention. In an embodiment, special purpose hardware (e.g., Application Specific Integrated Circuits, Field Programmable Gate Arrays (FPGAs), and so forth) can be used to implement various aspects of the present invention.

Of course, the processing system 100 may also include other elements (not shown), as readily contemplated by one of skill in the art, as well as omit certain elements. For example, various other input devices and/or output devices can be included in processing system 100, depending upon the particular implementation of the same, as readily understood by one of ordinary skill in the art. For example, various types of wireless and/or wired input and/or output devices can be used. Moreover, additional processors, controllers, memories, and so forth, in various configurations can also be utilized. These and other variations of the processing system 100 are readily contemplated by one of ordinary skill in the art given the teachings of the present invention provided herein.

Moreover, it is to be appreciated that various figures as described below with respect to various elements and steps relating to the present invention that may be implemented, in whole or in part, by one or more of the elements of system 100.

As employed herein, the term "hardware processor subsystem" or "hardware processor" can refer to a processor, memory, software or combinations thereof that cooperate to perform one or more specific tasks. In useful embodiments, the hardware processor subsystem can include one or more data processing elements (e.g., logic circuits, processing circuits, instruction execution devices, etc.). The one or more data processing elements can be included in a central processing unit, a graphics processing unit, and/or a separate processor- or computing element-based controller (e.g., logic gates, etc.). The hardware processor subsystem can include one or more on-board memories (e.g., caches, dedicated memory arrays, read only memory, etc.). In some embodiments, the hardware processor subsystem can include one or more memories that can be on or off board or that can be dedicated for use by the hardware processor subsystem (e.g., ROM, RAM, basic input/output system (BIOS), etc.).

In some embodiments, the hardware processor subsystem can include and execute one or more software elements. The one or more software elements can include an operating system and/or one or more applications and/or specific code to achieve a specified result.

In other embodiments, the hardware processor subsystem can include dedicated, specialized circuitry that performs one or more electronic processing functions to achieve a specified result. Such circuitry can include one or more application-specific integrated circuits (ASICs), FPGAs, and/or PLAs.

These and other variations of a hardware processor subsystem are also contemplated in accordance with embodiments of the present invention.

Figure 2:
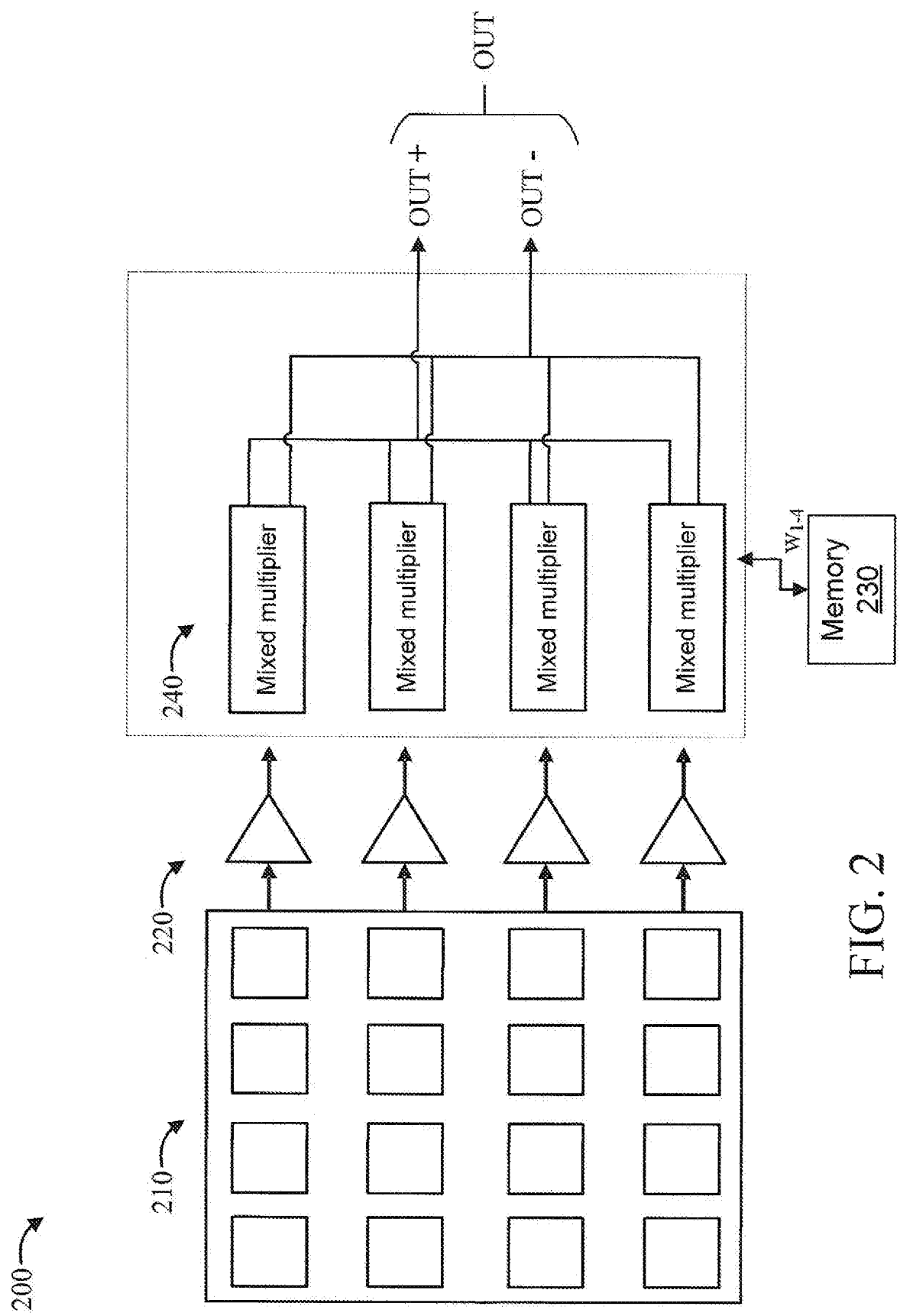
FIG. 2 is a block diagram showing an exemplary mixed-signal dot product computation circuit, in accordance with an embodiment of the present invention.

FIG. 2 is a block diagram showing an exemplary mixed-signal dot product computation circuit 200, in accordance with an embodiment of the present invention.

The mixed-signal dot product computation circuit 200 includes an array 210 of sensor nodes, a set of amplifiers 220, a memory 230, and a set of mixed multiplier branches (or "mixed multipliers" in short) 240. For the sake of illustration, an arbitrary selection of four was made for the number of mixed multipliers 240. However, in other embodiments, other numbers of mixed multipliers can be used.

From the set of mixed multipliers 240, a differential output OUT (OUT$^{30}$ and OUT$^-$) is provided.

The memory 230 provides digital values $W_{1-4}$.

Figure 3:
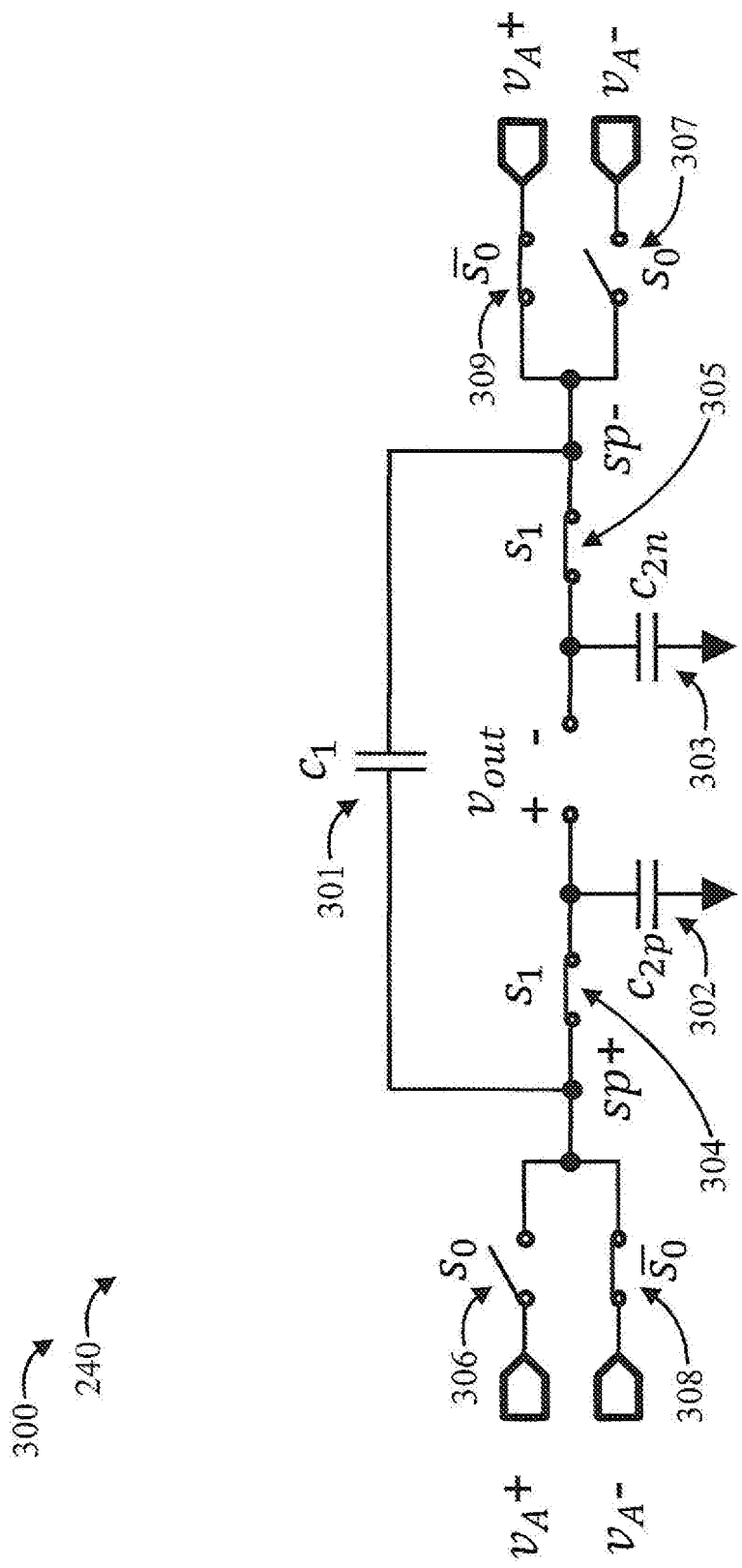
FIG. 3 is a block diagram showing an exemplary differential mixed-signal multiplier with three capacitors, in accordance with an embodiment of the present invention.

FIG. 3 is a block diagram showing an exemplary differential mixed-signal multiplier 300 with three capacitors, in accordance with an embodiment of the present invention.

In an embodiment, the differential mixed-signal multiplier 300 can be one of the mixed multipliers 240 in the mixed-signal dot product computation circuit 200 of FIG. 2.

The differential mixed-signal multiplier 300 includes differential inputs $V_{A^+}$ and $V_{A^-}$.

The differential mixed-signal multiplier 300 includes a differential output $v_{out}$.

The differential mixed-signal multiplier 300 includes a capacitor $c_1$ 301, a capacitor $c_{2p}$ 302, a capacitor $c_{2n}$ 303, a switch $s_1$ 304, another switch $s_1$ 305, a switch $s_0$ 306, another switch $s_0$ 307, a switch $\overline{s_0}$ 308, and another switch $\overline{s_0}$ 309.

One end of capacitor $c_1$ 301 is coupled to a node sp$^+$, and the other end of capacitor $c_1$ 301 is coupled to a node sp$^-$.

Node sp$^+$ is also coupled to one side of switch $s_0$ 306, one side of switch $\overline{s_0}$ 308, and one side of switch $s_1$ 304. The other side of switch $s_0$ 306 is coupled to input $v_{A^+}$. The other side of switch $\overline{s_0}$ 308 is coupled to input $v_{A^-}$. The other side of switch $s_1$ 304 is coupled to one side of capacitor $c_{2p}$ 302. The other side of capacitor $c_{2p}$ 302 is connected to ground.

Node sp$^-$ is also coupled to one side of switch $s_0$ 307, one side of switch $\overline{s_0}$ 309, and one side of switch $s_1$ 305. The other side of switch $s_0$ 307 is coupled to input $v_{A^+}$. The other side of switch $\overline{s_0}$ 309 is coupled to input $v_{A^-}$. The other side of switch $s_1$ 305 is coupled to one side of capacitor $c_{2n}$ 303. The other side of capacitor $c_{2n}$ 303 is connected to ground.

$b_n \in \{-1,1\}$ in differential version.

$v_{A+} = v_{A-} = v_{cm}$ in reset stage.

TABLE 1 is a table showing signals relating to the various processing stages of the differential mixed signal multiplier with three capacitors, in accordance with an embodiment of the present invention.

TABLE 1

| | phase | $s_0$ | $s_1$ | $v_{sp+}$ | $v_{sp-}$ | $v_{out}$ |
|---|---|---|---|---|---|---|
| | reset | 1 | 1 | $v_{cm}$ | $v_{cm}$ | 0 |
| n = 0 | sample | $b_0$ | 0 | $v_{cm} + b_0 v_A/2$ | $v_{cm} - b_0 v_A/2$ | 0 |
| | accumulation | 0 | 1 | $v_{cm} + 0.5 b_0 v_A$ | $v_{cm} - 0.5 b_0 v_A$ | $b_0 v_A$ |
| n = 1 | sample | $b_1$ | 0 | $v_{cm} + b_1 v_A$ | $v_{cm} - b_1 v_A$ | $b_0 v_A$ |
| | accumulation | 0 | 1 | $v_{cm} + (0.5 b_1 + 0.5^2 b_0) v_A$ | $v_{cm} - (0.5 b_1 + 0.5^2 b_0) v_A$ | $(b_1 + 0.5 b_0) v_A$ |
| ... | ... | ... | ... | ... | ... | ... |
| n = 7 | sample | $b_7$ | 0 | $v_{cm} + b_7 v_A$ | $v_{cm} - b_7 v_A$ | ... |
| | accumulation | 0 | 1 | ... | ... | $(b_7 + 0.5 b_6 \ldots + 0.5^7 b_0) v_A$ |

A description will now be given regarding capacitor sizing, in accordance with an embodiment of the present invention.

In an embodiment, capacitor $c_1$ 301=c/2.
In an embodiment, capacitor $c_{2p}$ 302=c.
In an embodiment, capacitor $c_{2n}$ 303=c.

Figure 4:
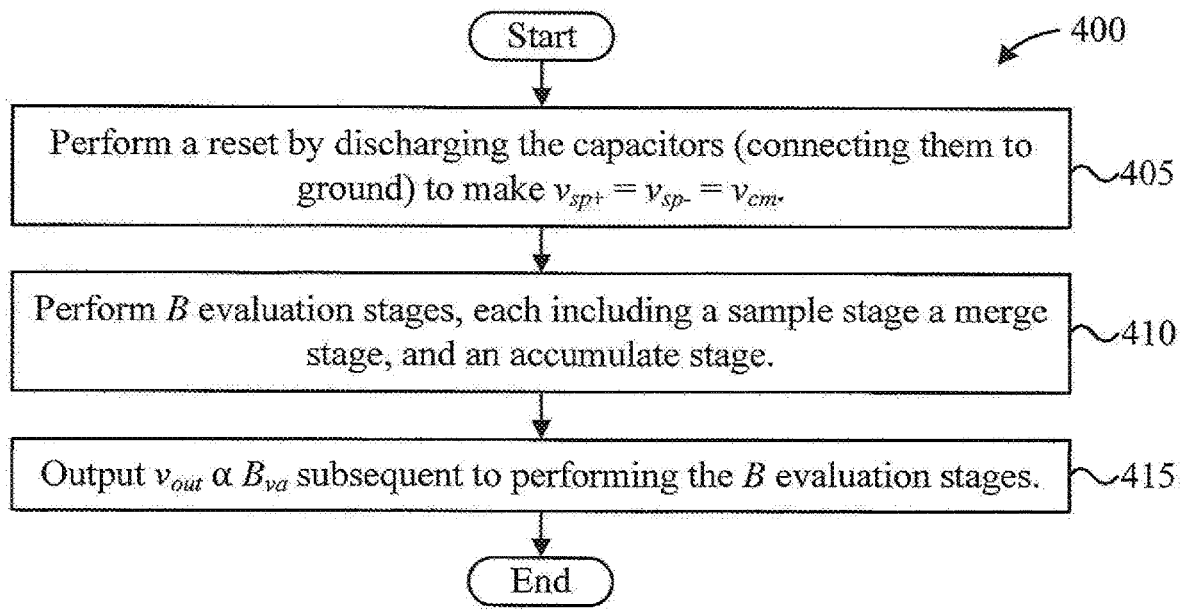
FIG. 4 is a flow diagram showing an exemplary dot product computation method, in accordance with an embodiment of the present invention.

FIG. 4 is a flow diagram showing an exemplary dot product computation method 400, in accordance with an embodiment of the present invention.

At block 405, perform a reset by discharging the capacitors (e.g., connecting them to ground) to make $v_{sp+}=v_{sp-}=v_{cm}$. In another embodiment, the capacitors can be discharged by connecting them to a discharging potential.

At block 410, perform B evaluation stages, each including a sample stage, a merge stage, and an accumulation stage. Thus, for a n-th evaluation stage (for N-bit value, this stage is iterated by N times), the following applies:

(a) sample: for a n-th bit, sample node sp+ has a voltage $v_{cm} + b_n v_A$, whereas sampling node sp– has a voltage $v_{cm} - b_n v_A$.

(b) accumulation: the nodes sp+ and sp– are charge-shared. Similarly, sp– and $v_{out-}$ are charge-shared. Therefore, $v_{out}=(b_n+0.5 b_{n-1} \ldots +0.5^n b_0) v_A$.

At block 415, output $v_{out} \propto B v_A$.

A description will now be given regarding a Multiplier And Accumulator (MAC) operation, in accordance with an embodiment of the present invention.

In many signal processing and machine learning applications, the multiplied results are supposed to be summed up (in a so called MAC operation).

Here, the positive and negative ports of the multipliers can be separately connected to positive and negative rails, respectively, through a charge-sharing operation.

Figure 5:
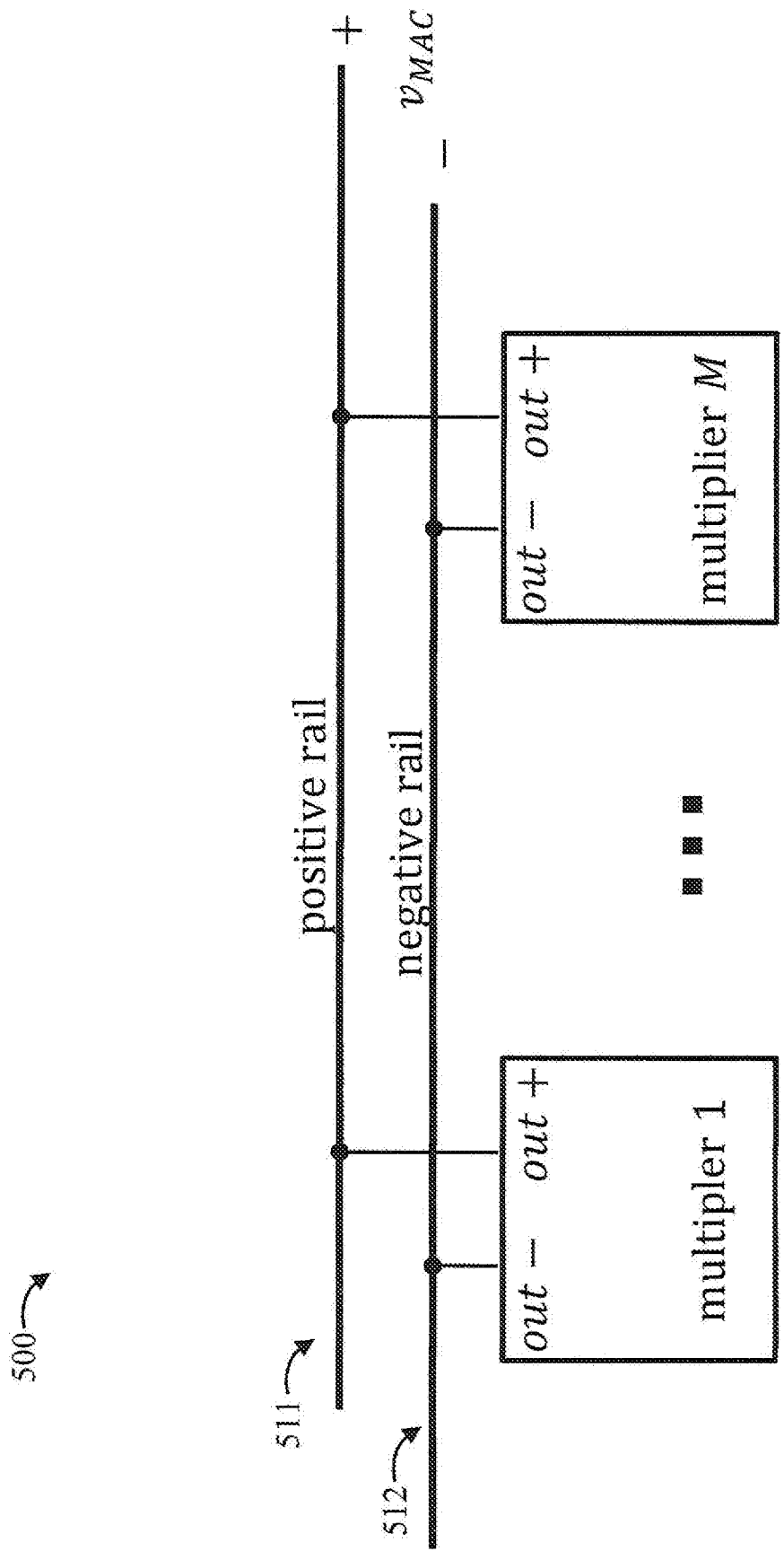
FIG. 5 is a block diagram showing an exemplary Multiplier and Accumulator (MAC) operation configuration, in accordance with an embodiment of the present invention.

FIG. 5 is a block diagram showing an exemplary Multiplier and Accumulator (MAC) operation configuration 500, in accordance with an embodiment of the present invention.

As shown, multiplier outputs out+ of multipliers 1 through M are connected to a positive rail 511 at a voltage $v_{MAC^+}$, and multiplier outputs out– of multipliers 1 through M are connected to a negative rail 512 at a voltage $v_{MAC^+}$.

The following applies in a MAC operation:

$$MAC = \Sigma_{m=1}^{M} W_m X_m.$$

Figure 6:
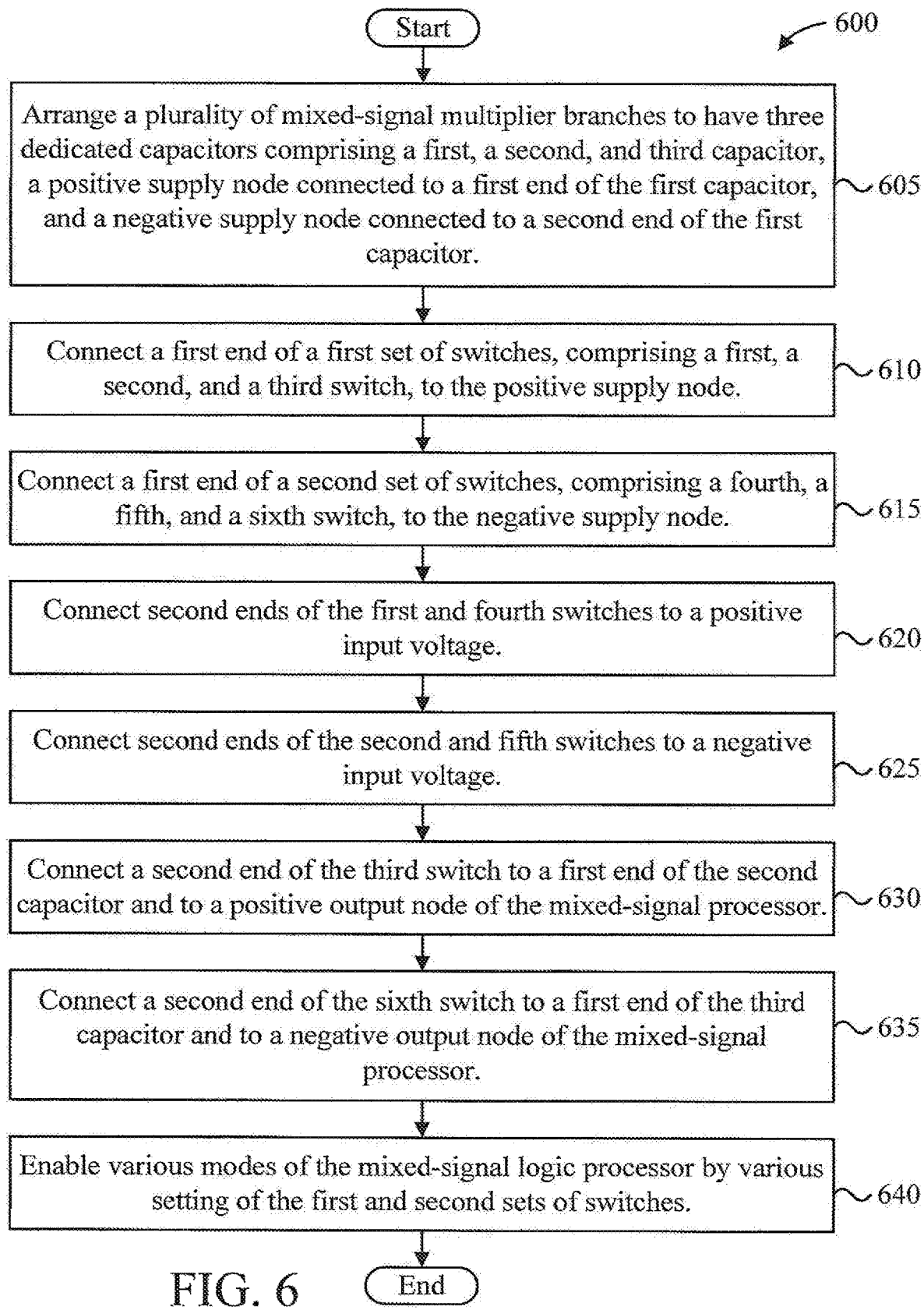
FIG. 6 is a flow diagram showing an exemplary method for forming a mixed-signal logic processor, in accordance with an embodiment of the present invention.

FIG. 6 is a flow diagram showing an exemplary method 600 for forming a mixed-signal logic processor, in accordance with an embodiment of the present invention.

At block 605, arrange a plurality of mixed-signal multiplier branches to have three dedicated capacitors comprising a first, a second, and third capacitor, a positive supply node connected to a first end of the first capacitor, and a negative supply node connected to a second end of the first capacitor. In an embodiment, the first capacitor is connected across the second and third capacitors, and has a capacitance value of one half of the second and third capacitors. In an embodiment, a differential output is provided across the second and third capacitors.

At block 610, connect a first end of a first set of switches, comprising a first, a second, and a third switch, to the positive supply node.

At block 615, connect a first end of a second set of switches, comprising a fourth, a fifth, and a sixth switch, to the negative supply node.

At block 620, connect second ends of the first and fourth switches to a positive input voltage.

At block 625, connect second ends of the second and fifth switches to a negative input voltage.

At block 630, connect a second end of the third switch to a first end of the second capacitor and to a positive output node of the mixed-signal processor.

At block 635, connect a second end of the sixth switch to a first end of the third capacitor and to a negative output node of the mixed-signal processor.

At block 640, enable various modes of the mixed-signal logic processor by various setting of the first and second sets of switches.

Figure 7:
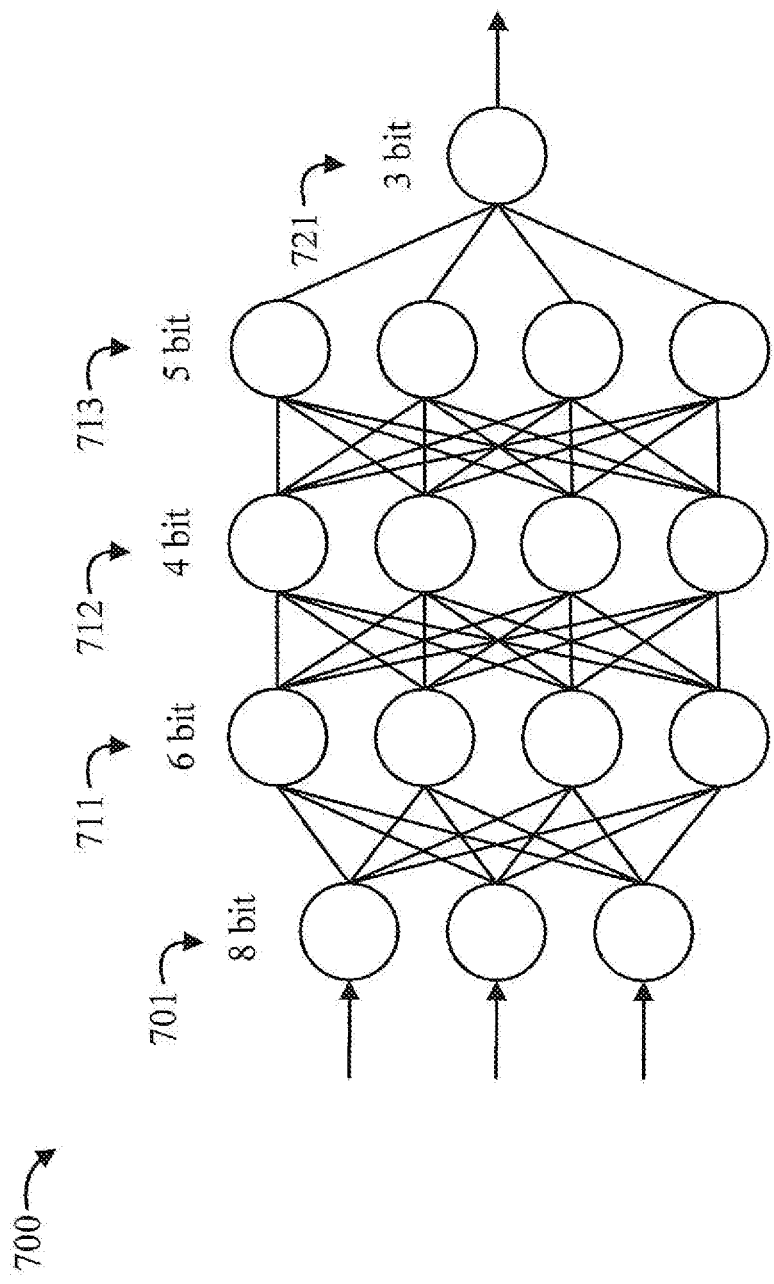
FIG. 7 is a block diagram showing exemplary bit-precision requirements across layers of a deep neural network, in accordance with an embodiment of the present invention.

FIG. 7 is a block diagram showing exemplary bit-precision requirements 700 across layers of a deep neural network, in accordance with an embodiment of the present invention.

As can be seen, the bit-precision requirements 700 include 8 bits, 6 bits, 4 bits, 5 bits, and 3 bits of precision, depending upon the implicated layer. In particular, the input layer 701 requires 8 bit precision, the first 711, second 712, and third hidden layers 713 require 6 bit, 4 bit, and 5 bit precision, respectively, and the output layer 721 requires 3 bits of precision.

Figure 8:
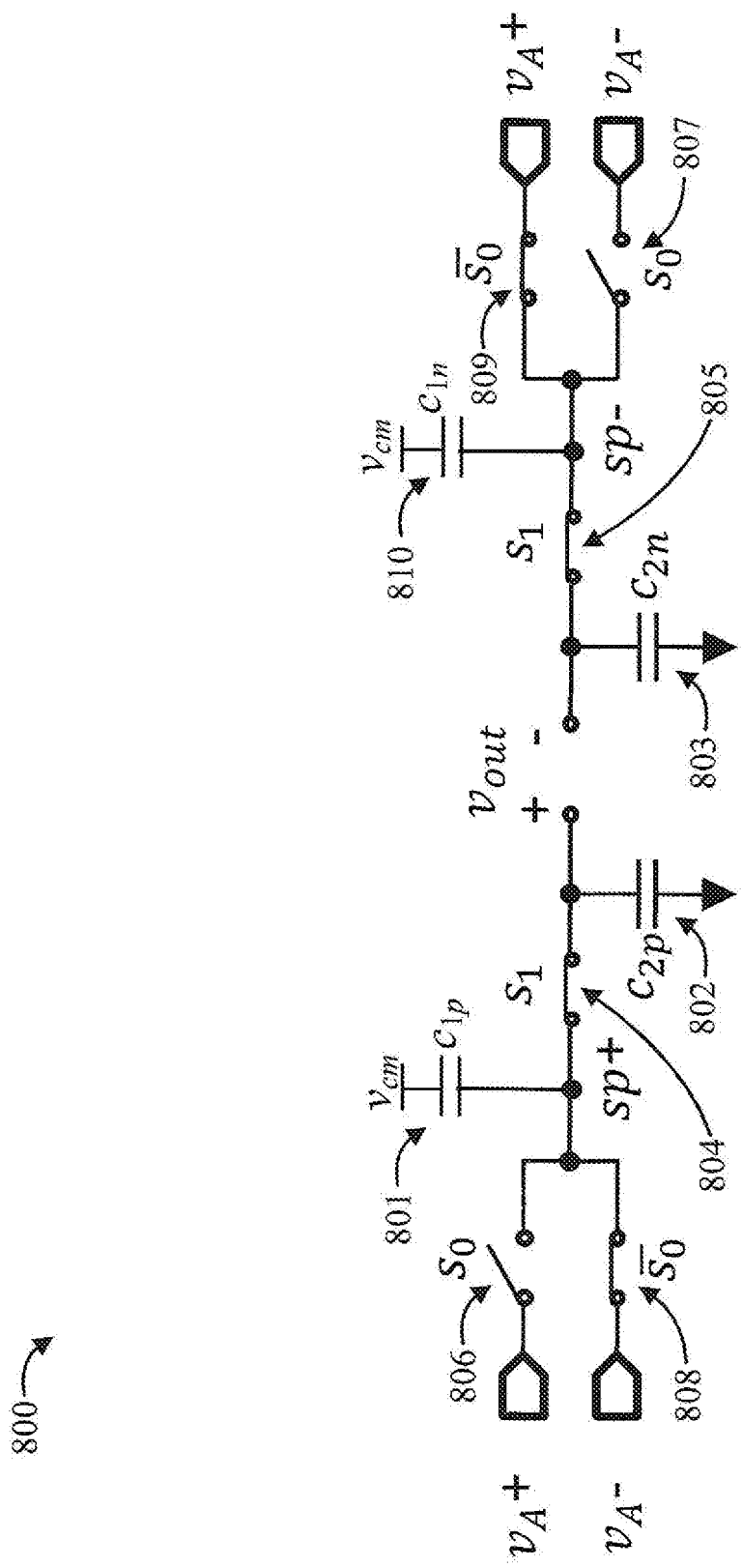
FIG. 8 is a diagram showing an exemplary initial design 800 from which the design of FIG. 3 was obtained, in accordance with an embodiment of the present invention.

FIG. 8 is a diagram showing an exemplary initial design 800 from which the design of FIG. 3 was obtained, in accordance with an embodiment of the present invention. Initial design 800 includes four capacitors in total, where the design of FIG. 3 combines capacitors $c_{1p}$ and $c_{1n}$ of FIG. 8 and having identical values of C into a single capacitor $c_1$ in FIG. 3 having a value of C/2. Thus, design 800 requires four capacitors of size C, while the design of FIG. 3 requires only 3 capacitors of values C, C, and C/2, thus saving space and cost. $C_{total}$ of the capacitors $c_{1p}$ and $c_{1n}$ of FIG. 8=$1/(1/c_{1p}+1/c_{1n})$=C/2. Thus, the design of FIG. 3 provides an opportunity to save the capacitor area by half relative to capacitors $c_{1p}$ and $c_{1n}$ of FIG. 8.

The differential mixed-signal multiplier 800 includes differential inputs $v_{A^+}$ and $v_{A^-}$.

The differential mixed-signal multiplier 800 includes a differential output $v_{out}$.

The differential mixed-signal multiplier 800 includes a capacitor $c_{1p}$ 801, a capacitor $c_{1p}$ 810, a capacitor $c_{2p}$ 802, a capacitor $c_{2p}$ 803, a switch $s_1$ 804, another switch $s_1$ 805, a switch $s_0$ 806, another switch $s_0$ 807, a switch $\overline{s_0}$ 808, and another switch$\overline{s_0}$ 809.

One end of capacitor $c_{1p}$ 801 is coupled to a node sp$^+$, and one end of capacitor $c_{1n}$ 810 is coupled to a node sp$^-$. The other ends of capacitor $c_{1p}$ 801 and capacitor $c_{1p}$ 810 are connected to $v_{cm}$.

Node sp$^+$ is also coupled to one side of switch $s_0$ 806, one side of switch $\overline{s_0}$ 808, and one side of switch $s_1$ 804. The other side of switch $s_0$ 806 is coupled to input $v_{A^+}$. The other side of switch $\overline{s_0}$ 808 is coupled to input $v_{A^-}$. The other side of switch $s_1$ 804 is coupled to one side of capacitor $c_{2p}$ 802. The other side of capacitor $c_{2p}$ 802 is connected to ground.

Node sp$^-$ is also coupled to one side of switch $s_0$ 807, one side of switch $\overline{s_0}$ 809, and one side of switch $s_1$ 805. The other side of switch $s_0$ 807 is coupled to input $v_{A^+}$. The other side of switch $\overline{s_0}$ 809 is coupled to input $v_{A^-}$. The other side of switch $s_1$ 805 is coupled to one side of capacitor $c_{2n}$ 803. The other side of capacitor $c_{2n}$ 803 is connected to ground.

A description will now be given regarding various benefits provided by embodiments of the present invention.

One or more embodiments of the present invention provide a multiplier that uses only three capacitors for any bit precision requirements, which significantly saves area and energy cost.

One or more embodiments of the present invention cover the signed representation for both operands in the multiplication.

One or more embodiments of the present invention use a differential input for higher signal integrity.

One or more embodiments of the present invention compute the dot product, which is the summation across many multiplied results.

One or more embodiments of the present invention perform mixed-signal multiplication without using an offset.

These and a myriad of other attendant advantages of embodiments of the present invention are readily determined by one of ordinary skill in the art given the teachings of the present invention provided herein.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment. However, it is to be appreciated that features of one or more embodiments can be combined given the teachings of the present invention provided herein.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended for as many items listed.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Having described preferred embodiments of a system and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A differential mixed-signal logic processor, comprising:
   a plurality of mixed-signal multiplier branches for multiplication of an analog value A and a N-bit digital value B, each of the plurality of mixed-signal multiplier branches include:
   a first capacitor connected across a second capacitor and a third capacitor to provide a differential output across the second and third capacitors,
   wherein a capacitance of the first capacitor is equal to half a capacitance of the second and third capacitors.

2. The differential mixed-signal logic processor of claim 1, further comprising:
   a positive supply node connected to a first end of the first capacitor;
   a negative supply node connected to a second end of the first capacitor.

3. The differential mixed-signal logic processor of claim 1, further comprising:
   a first set of switches comprising a first, a second, and a third switch, each having a first end coupled to the positive supply node; and
   a second set of switches comprising a fourth, a fifth, and a sixth switch, each having a first end coupled to the negative supply node.

4. The differential mixed signal logic processor of claim 1, wherein second ends of the first and fourth switches are connected to a positive input voltage, wherein second ends of the second and fifth switches are connected to a negative input voltage, wherein a second end of the third switch is connected to the first end of the second capacitor and to a positive output node, and wherein a second end of the sixth switch is connected to the first end of the third capacitor and to a negative output node.

5. The differential mixed-signal logic processor of claim 4, wherein second ends of the second and third capacitors are connected to ground.

6. The differential mixed-signal logic processor of claim 4, wherein the first and second switches provides complimentary inputs to the positive supply node, and wherein the fourth and fifth switches provide complimentary inputs to the negative supply node.

7. The differential mixed-signal logic processor of claim 4, wherein the differential mixed-signal logic processor is configured to compute a dot product between an analog value vector and a digital value vector.

8. The differential mixed-signal logic processor of claim 7, wherein the differential mixed-signal logic processor is comprised in a system having at least one sensor and a memory device, wherein the analog value vector is received from the at least one sensor and the digital value is received from the memory device.

9. The differential mixed-signal logic processor of claim 7, wherein a sample mode samples the analog value vector using a single branch-dedicated capacitor in each of the plurality of mixed-signal multiplier branches to store a sample value.

10. The differential mixed-signal logic processor of claim 4, wherein a capacitance of the first capacitor is equal to half a capacitance of any of the second and third capacitors.

11. The differential mixed-signal logic processor of claim 4, wherein capacitor-wise, each of the plurality of mixed-signal multiplier branches include only the three dedicated capacitors.

12. The differential mixed-signal logic processor of claim 4, wherein the various modes of the differential mixed-signal logic processor comprises a reset mode, a sample mode, and an accumulate mode.

13. The differential mixed-signal logic processor of claim 4, wherein during an accumulation mode of the differential mixed-signal logic processor, the positive supply node and the positive output node are charge shared, and the negative supply node and the negative output node are charge shared.

14. The differential mixed-signal logic processor of claim 4, wherein during a reset mode of the differential mixed-signal logic processor, the positive supply node and the negative supply node have a same potential.

15. The differential mixed-signal logic processor of claim 4, wherein the first and second switches form a first switch pair, and the fourth and fifth switches form a second switch pair, and wherein the switches in each of the first and second switch pairs are complimentary to each other in either supplying one of the positive input voltage or the negative input voltage at a given time.

16. The differential mixed-signal logic processor of claim 4, further comprising:
a positive supply rail connected to the positive output node; and
a negative supply rail connected to the negative output node,
wherein the positive and negative supply rails are deployed for a multiplier and accumulator operation.

17. The differential mixed-signal logic processor of claim 4, wherein a charge-sharing operation is performed to connect the positive supply rail to the positive output node, and the negative supply rail to the negative output node.

18. The differential mixed-signal logic processor of claim 1, wherein the multiplication of the analog value A and the N-bit digital value B, wherein the N-bit digital value B is calculated $B=2^{N-1}b_{N-1}+2^{N-1}b_{N-2}\ldots+2^{0}b_{0}$, where $b_n$ is a binary value at an n-th bit position.

19. A method for forming a differential mixed-signal processor, comprising:
arranging each a plurality of mixed-signal multiplier branches for multiplication of an analog value and a N-bit digital value B to include a first capacitor connected across a second capacitor and a third capacitor to provide a differential output across the second and third capacitors,
wherein a capacitance of the first capacitor is equal to half a capacitance of the second and third capacitors.

20. The method of claim 19, further comprising arranging the each of the plurality of mixed-signal multiplier branches to have a positive supply node connected to a first end of the first capacitor, and a negative supply node connected to a second end of the first capacitor.

* * * * *